United States Patent [19]

Arii

[11] Patent Number: 4,797,054

[45] Date of Patent: Jan. 10, 1989

[54] APPARATUS FOR LOADING AND UNLOADING A VACUUM PROCESSING CHAMBER

[75] Inventor: Katsuyuki Arii, Tama, Japan

[73] Assignee: Fujitsu Limited, Kawasaki, Japan

[21] Appl. No.: 874,000

[22] Filed: Jun. 13, 1986

[30] Foreign Application Priority Data

Jun. 17, 1985 [JP] Japan ................... 60-131013

[51] Int. Cl.$^4$ ............................. B65G 11/00
[52] U.S. Cl. ........................ 414/217; 414/225
[58] Field of Search ............... 414/217, 222, 225, 226, 414/749, 751; 118/50, 719, 715, 733

[56] References Cited

U.S. PATENT DOCUMENTS

| | | | |
|---|---|---|---|
| 3,641,973 | 2/1972 | Shrader | 118/719 |
| 3,656,454 | 4/1972 | Schrader | 414/217 X |
| 3,874,525 | 4/1975 | Hassan et al. | 414/225 |
| 3,915,117 | 10/1975 | Schertler | 118/719 |
| 4,226,208 | 10/1980 | Nishida et al. | 118/719 X |
| 4,508,055 | 4/1985 | Elton et al. | 118/50 X |
| 4,553,069 | 11/1985 | Purser | 414/225 X |
| 4,632,624 | 12/1986 | Mirkovich et al. | 414/217 |

FOREIGN PATENT DOCUMENTS 2207957 9/1972 Fed. Rep. of Germany ...... 118/719
60-27114 2/1985 Japan .

Primary Examiner—Peter A. Aschenbrenner
Assistant Examiner—James R. Brittain
Attorney, Agent, or Firm—Staas & Halsey

[57] ABSTRACT

A main chamber is provided through which a workpiece is loaded or unloaded. A second chamber is provided within the main chamber to cover the workpiece during evacuation and gas introduction processes performed within the main chamber. The second chamber protects the workpiece from floating dust deposited on parts within the main chamber and blown about by a turbulent flow of introduced or evacuated gas therein. The second chamber can be shaped like a bell jar and is made as small as possible. A driving circuit lifts the bell jar up and down. The gas pressure within the second chamber is maintained greater than or equal to that of the main chamber by a pressure control circuit to prevent dust intrusion into the second chamber. A slow leak circuit is provided as a pressure control device by forming a loose vacuum-seal between the second chamber and the main chamber. A gas introduction circuit and/or evacuation circuit may be connected to the second chamber. A workpiece transfer device is located at the outside of the second chamber. The second chamber may be part of a vacuum processing chamber, thereby allowing the workpiece to be directly loaded into and unloaded from the processing chamber.

12 Claims, 8 Drawing Sheets

APPARATUS FOR LOADING AND UNLOADING A VACUUM PROCESSING CHAMBER

BACKGROUND OF THE INVENTION

1. Field of the Invention

The present invention relates to a device for loading and unloading a workpiece into and from a vacuum chamber which is used for semiconductor production and the like. More particularly, the present invention relates to a loading device for a vacuum chamber in which dust contamination of workpieces must be strictly avoided.

2. Description of the Related Art

Vacuum chambers are widely used for chemical and physical processing, such as evaporation, sputtering, ion plating, etching, etc., of, for example, semiconductor materials. Recently developed VLSICs (Very Large Scale Integrated Circuits) require a sub-micron fabrication precision. However, the size of IC chips and the size of the wafers on which the ICs are fabricated are both becoming larger. Thus, the amount of dust contaminating the workpiece must be reduced because it directly affects the yield and quality of IC production. Therefore, reduction of the amount of dust within the atmosphere in which the workpiece is processed becomes an essential requirement to achieve high quality and an increased production yield of VLSICs.

There are several methods in which dust contamination of a workpiece in a vacuum occurs. The first method is contamination caused by dust which has already been deposited on the workpieces or tools, such as chip transfer devices, before they are input to the vacuum chamber. The second method is contamination caused by dust in the gas in the vacuum chamber before it is evacuated. The third method is contamination caused by dust previously deposited on various parts within the chamber that is blown about by a turbulent gas flow while gas is evacuated or introduced into the chamber.

There have been extensive efforts to reduce the dust in the processing atmosphere. Particularly, in order to overcome the above-described third contamination problem, loading and unloading chambers, (referred to hereinafter as loading chambers), have been used. Examples of loading chambers are shown in FIGS. 1 and 2. In FIGS. 1 and 2, a loading chamber 2, 2' or 4 is coupled to a processing chamber 1 where the workpiece is processed. The workpiece is moved in and out of the processing chamber through the loading chambers. The loading chambers 2, 2' or 4 are connected to the processing chamber 1 by gates 11 or 12 capable of being opened as well as vacuum-sealed. The system shown in FIG. 1 is provided with a vacuum chamber 2 used exclusively for loading workpieces into the processing chamber 1, and a vacuum chamber 2' used exclusively for unloading workpieces from the processing chamber 1. The system of FIG. 2 is provided with a single loading chamber 4 used for both loading and unloading workpieces. These two types of loading and unloading chamber systems are so-called load-lock systems.

With reference to FIGS. 1 and 2, the procedure for loading and unloading workpieces into or from the processing vacuum chamber 1 is as follows. A gate 21 of the loading chamber 2 (FIG. 1) or a gate 41 of the loading chamber 4 (FIG. 2) is opened. Workpieces are introduced through the opened gate 21 or 41 and placed in the loading chamber 2 or 4. The gate 21 or 41 is then closed and there is a several minute wait until the floating dust in the chamber 2 or 4 settles. Then, the loading chamber 2 or 4 is evacuated by a vacuum pump 23 or 43. The processing chamber 1 has been previously evacuated by a pump 14. Gate 11 is then opened and the workpiece is transferred into the processing chamber 1. When unloading workpieces from the processing chamber 1 in FIGS. 1 or 2, the loading chamber 2' or 4 is evacuated by a vacuum pump 33 or 43, respectively, and a gate 12 between the chamber 1 and 2' or a gate 11 between the chamber 1 and 4, is opened. The workpiece is transferred from the processing chamber 1 to the loading chamber 2' or 4 through the opened gate 12 or 11, respectively. After the gate 12 or 11 is closed, a gas introduction device 32 or 42 fills the chamber 2' or 4 with gas, and then gate 31 or 41 is opened to remove the workpiece from the loading chamber 2' or 4.

The above-mentioned gas introduced into the loading chambers 2, 2' and 4 is extensively filtered by a filtering device (not shown) to minimize the amount of dust contained therein. Inert gas, such as pure nitrogen, is generally used to avoid introduction of a chemically active gas which may harm the workpiece.

In the above-described prior art vacuum chamber system, including the loading chambers, during the evacuation cycle or gas introduction cycle for chamber 1, dust which is deposited on various parts of the chamber is blown up, but the workpiece is not in the processing chamber. When a workpiece is moved in or out of the processing chamber 1, the processing chamber is already evacuated and the floating dust has settled since dust cannot float in a vacuum. Therefore, there is no problem with dust in the processing vacuum chamber 1.

However, in the loading chamber 2, 2' or 4, during the evacuation cycle or gas introduction cycle, dust, already deposited on various parts of the loading chamber is blown about by a turbulent flow of gas and may settle on the workpiece. This type of contamination corresponds to the third contamination method, as described above, by which dust can contaminate a workpiece.

To reduce dust in the loading or unloading chamber, several other methods have been proposed. For example, provisional publication of Japanese Patent No., TOKUKAI 60-27114, Feb. 12, 1985, by Tsuchiya, discloses a method for reducing dust accumulated on surfaces of various portions within the chamber. This method includes a procedure of repeating gas introduction and evacuation cycles of the loading chamber before a workpiece is placed therein. Gas introduced into the chamber produces a turbulent flow which blows dust into the gas atmosphere of the chamber. By evacuating this gas, the floating dust in the gas is exhausted with the gas. Repetition of this cycle reduces the amount of dust within the chamber.

Though the prior art, as described above, is effective to some degree in reducing the amount of dust in the workpiece atmosphere, there still exists a need to reduce even more the amount of dust deposited on a workpiece to achieve better yields and better quality VLSIC production.

SUMMARY OF THE INVENTION

It is an object of the present invention to provide an apparatus for drastically reducing dust deposition on a workpiece in a vacuum chamber system.

Another object of the present invention is to provide a system in which a workpiece is protected from deposition of dust during the evacuation and gas introduction cycles of the vacuum chamber.

Other objects of the present invention include shortening the processing time, increasing the production yield and improving the characteristics of ICs.

The present invention provides a second vacuum chamber (hereinafter referred to as the second chamber) within a loading chamber through which a workpiece is loaded or unloaded. The second chamber can be opened and closed. The second chamber keeps the workpiece therein protected from the gas borne dust while the loading chamber is being evacuated or gas is being introduced therein. The area of the loading chamber outside the second chamber will be designated hereinafter as the main chamber. Gas pressure in the second chamber is always kept greater than or equal to that in the main chamber. This pressure difference between the second chamber and the main chamber prevents dust from migrating into the second chamber from the main chamber. To maintain the above-mentioned pressure difference, various means, such as pressure control means, can be provided. For example, the second chamber may include slow leak means. During an evacuation process, the main chamber is evacuated first, and when the pressure difference between the main chamber and the second chamber reaches a predetermined level, the slow leak means allows the gas in the second chamber to leak into the main chamber. During a gas introduction process, the second chamber is provided with gas introduction means by which the second chamber is first filled with gas, and then the main chamber is filled with gas by another gas introduction means. The second chamber may include another evacuation means to speed up the evacuation thereof. The second chamber may also be shaped like a bell jar capable of moving up and down in the main chamber. The bottom of the bell jar is opened when it is lifted up by a shifting means, and is closed when the bell jar is lowered onto a table. A transfer means, which transfers the workpiece, is located outside the second chamber so that the volume of the second chamber is kept small. This results in reducing the chance of dust being introduced therein.

The main chamber is connected to a processing chamber and the second gate means is provided between the main chamber and the processing chamber for transferring the workpiece between the main chamber and the processing chamber. The workpiece is loaded or unloaded from the processing chamber via the main chamber. The loading chamber may be used for both loading and unloading the workpiece in the processing chamber. In some cases, two loading chambers may be used for loading and unloading the workpiece, respectively.

The above-mentioned features and advantages of the present invention, together with other objects and advantages, which will become apparent, will be more fully described hereinafter.

BRIEF DESCRIPTION OF THE DRAWINGS

FIGS. 4–8 are schematic diagrams of successive steps of the loading procedure according to the system of the present invention shown in FIG. 3, wherein:

FIG. 4 is a diagram of the system when the main chamber is filled with gas in preparation for receiving a workpiece from the outside;

FIG. 5 is a diagram of the system when the gates of the main chamber and the second chamber are opened, and the workpiece is placed on transfer means;

FIG. 6 is a diagram of the system when the gates of the main chamber and the second chamber are closed, and both chambers are evacuated;

FIG. 7 is a diagram of the system when the second chamber is opened;

FIG. 8 is a diagram of thessystem when the gate between the main chamber and the processing chamber is opened, and the workpiece is transferred into the processing chamber by transfer means;

FIGS. 9–12 are diagrams of successive steps of the unloading procedure of the system of the present invention shown in FIG. 3, wherein:

FIG. 9 is a diagram of the system when the main chamber and the second chamber are evacuated in preparation for receiving the workpiece from the processing chamber;

FIG. 10 is a diagram of the system when the gate between the processing chamber and main chamber is opened, and the workpiece is transferred by transfer means into the second chamber;

FIG. 11 is a diagram of the system when the gate between the processing chamber and the main chamber is closed, the second chamber is closed, and the main chamber and the second chamber are filled with gas; and FIG. 12 is a diagram of the system when the second chamber and the gate to the outside are both opened, and the workpiece is transferred to the outside by the transfer means;

DESCRIPTION OF THE PREFERRED EMBODIMENTS

Figure 1:
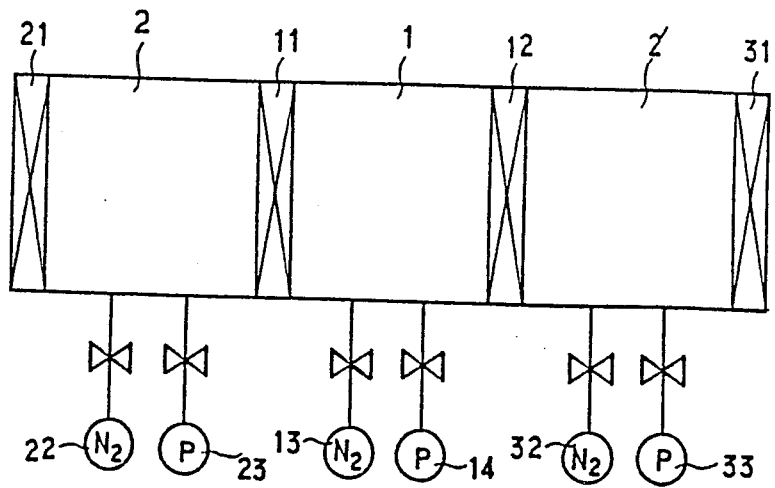
FIG. 1 is a schematic diagram of a prior art vacuum chamber system employing two loading chambers, one for loading a workpiece a processing chamber and one for unloading a workpiece from the processing chamber.
Figure 2:
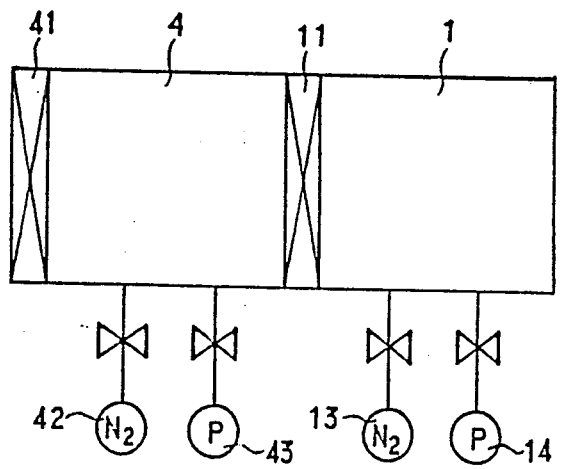
FIG. 2 is a schematic diagram of a prior art vacuum chamber system employing one loading chamber for both loading a workpiece into and unloading a workpiece from the processing chamber.
Figure 3:
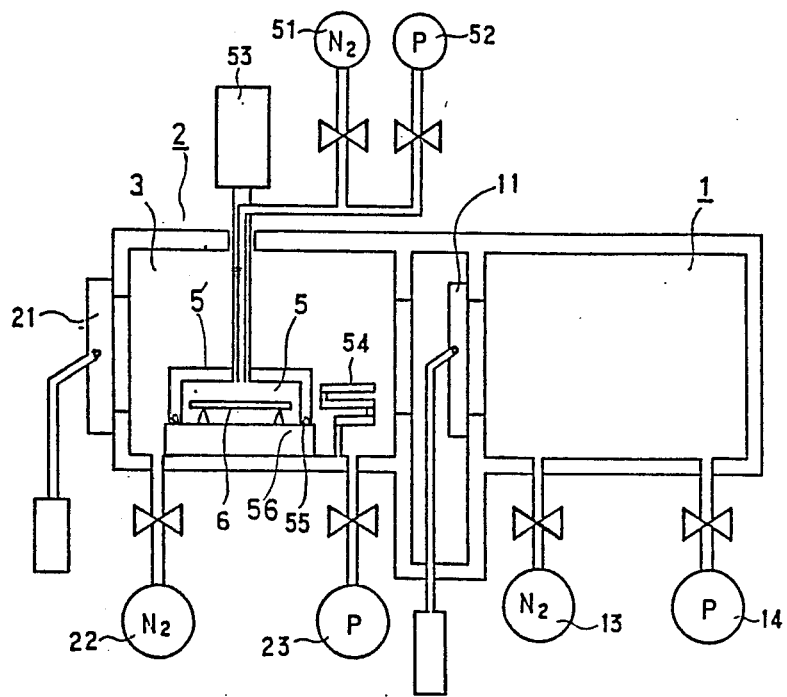
FIG. 3 is a schematic diagram of a vacuum chamber system in accordance with the present invention employing one loading chamber for both loading a workpiece into and unloading a workpiece from a processing chamber.

Referring now to the embodiment of the invention illustrated in FIG. 3, a loading chamber 2 for both loading a workpiece into and unloading a workpiece from a processing chamber 1 is shown. The processing chamber 1 is provided with a vacuum pump 14 and a gas introduction device 13, such as a pressurized gas tank, for intentionally introducing filtered air or inert gas, such as pure nitrogen, into the processing chamber 1. The processing chamber 1 is used for physical or chemical processing, such as sputtering or etching, etc. The devices for performing the physical or chemical processing are not shown in the figures. The loading chamber 2 is provided with a gate 21 which is capable of being vacuum sealed as well as opened to the outside, a second gate 11 which is capable of being vacuum sealed as well as opened to the processing chamber 1, a vacuum pump 23, gas introduction means 22, and transfer means 54 for transferring a workpiece 6 to or from the second chamber 5 and to or from the processing chamber 1.

According to the present invention, the loading chamber 2 is provided with a second chamber 5 in which the workpiece 6 is placed. Gas introduction means 51 introduces gas into the second chamber 5, and a vacuum pump 52 evacuates the second chamber 5. The second chamber 5 is separated from the main chamber 3 by a bell jar 5' having an opening at the bottom and having a loose vacuum seal 55, operating as slow leak means, at the periphery of the bottom opening of the bell jar 5'. The slow leak means 55 can be, for example, a finely finished or polished flat edge of the opening of the bell jar and a finely finished or polished flat surface of the table 56 on which the bell jar sits, an O-ring, etc. The bell jar 5' is also provided with driving means 53 to move the bell jar 5' up and down. The driving means 53 can be, for example, a stroke means, a hydraulic or air cylinder, a contact pressure control device or a spring, so as to provide an appropriate seal for the bell jar 5' with respect to the main chamber 3.

Figure 4:
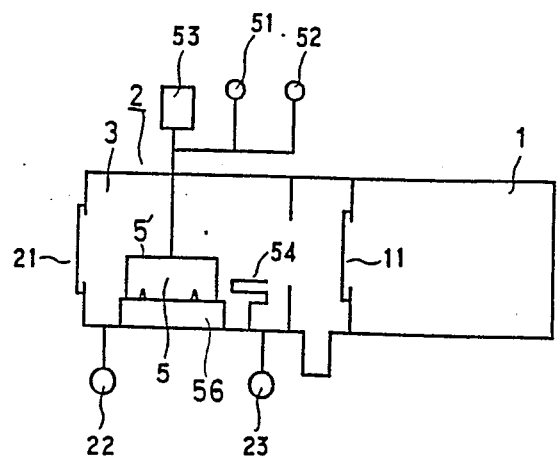

The procedure for loading the workpiece 6 into the processing chamber 1 is shown in FIGS. 4-8. In FIG. 4, filtered pure nitrogen gas is introduced into the second chamber 5 by gas introduction means 51, while the gates 11 and 21 are closed. When the gas pressure of the second chamber 5 becomes higher than that of the gas pressure of the main chamber 3, the gas in the second chamber 5 begins to leak through the slow leak means 55 (FIG. 3) into the main chamber 3 which is at a vacuum. After the gas is introduced into the second chamber 5, filtered pure nitrogen gas is introduced into the main chamber 3 through gas introduction means 22. The gas pressure in the second chamber 5 is always greater than or equal to that in the main chamber 3 during the above-described gas introduction process, so that dust can not intrude into the second chamber 5 from the main chamber 2. During the gas introduction process, dust within both chambers is blown up and floats in the gas due to the turbulent flow of the introduced gas. After the gas pressure reaches atmospheric pressure, everything remains as is for several minutes until the floating dust settles.

Figure 5:
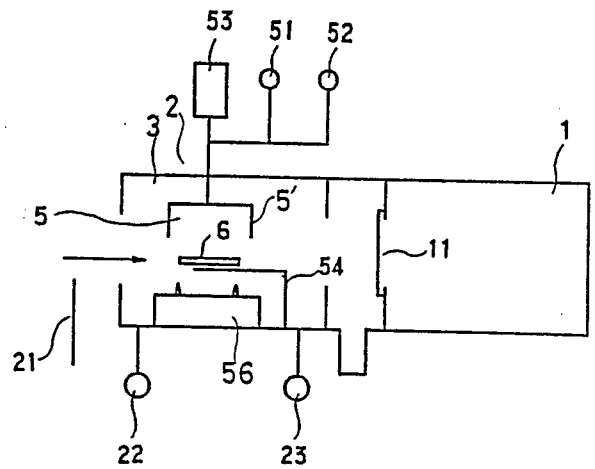

Next, as shown in FIG. 5, gate 21 is opened and the bell jar 5' is lifted up by driving means 53. The workpiece 6 is placed on the transfer means 54 which transfers the workpiece 6 onto a table 56 in the second chamber 5. The bell jar 5' is then lowered by the driving mechanism 53 to seal the second chamber 5.

Figure 6:
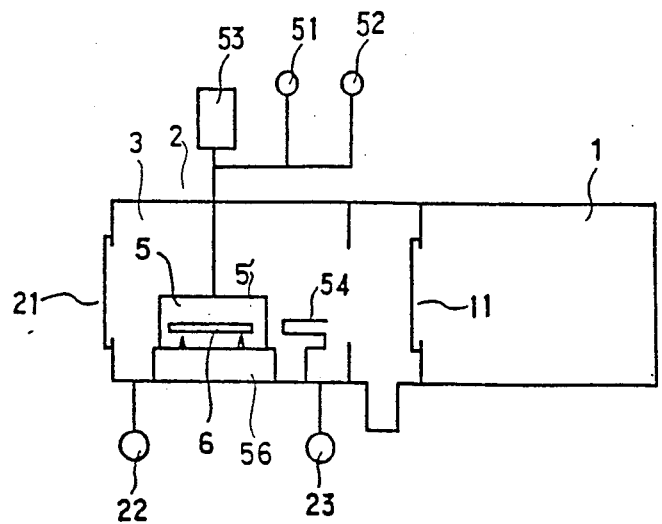

Next, as shown in FIG. 6, the main chamber 2 is evacuated by a vacuum pump 23, and then the second chamber 5 is evacuated by a vacuum pump 52. During this evacuating period, the gas pressure of the second chamber 5 is kept higher than that of the main chamber 3. When the pressure reaches a level lower than 1 milliTorr., dust cannot float and it settles. At this time, in a vacuum chamber system of the prior art, dust in the main chamber 3 settles on the workpiece because the workpiece is not covered. However, according to the present invention, dust in the main chamber 3 does not settle on the workpiece because it is covered by the bell jar 5'. Dust in the second chamber 5 may settle on the workpiece, but the amount of dust in the second chamber 5 is much less as compared with that in the main chamber 3. Because the amount of dust in a chamber is approximately proportional to the volume of the chamber, the volume of the second chamber 5 is made as small as possible. To make the second chamber 5 as small as possible and to avoid introducing dust into the second chamber 5, the carrier 54, for example, and other equipment and tools in the loading chamber are located outside the second chamber 5.

Figure 7:
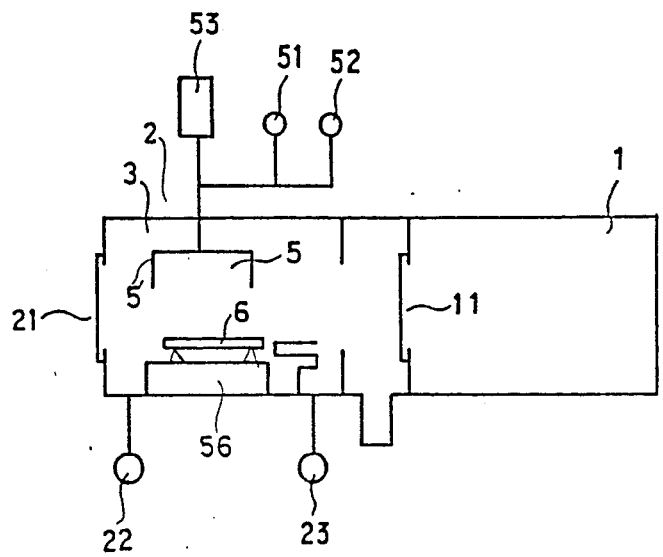

In FIG. 7, the bell jar 5' is opened by the driving means 53. At this time, no dust is deposited on the workpiece 6, because a turbulent gas flow is not produced by this opening action and since dust cannot float in a vacuum.

Figure 8:
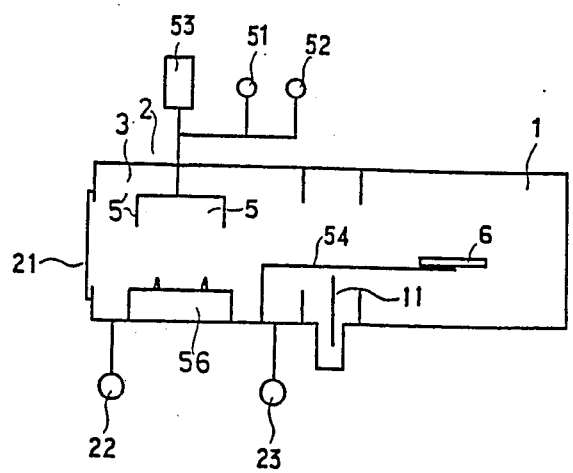

Next, as shown in FIG. 8, the gate 11 is opened and the carrier 54 transfers the workpiece 6 from the main chamber 3 to the processing chamber 1, which has already been evacuated and therefore no dust is floating in chamber 1. Gate 11 is then closed to complete the loading process.

Figure 9:
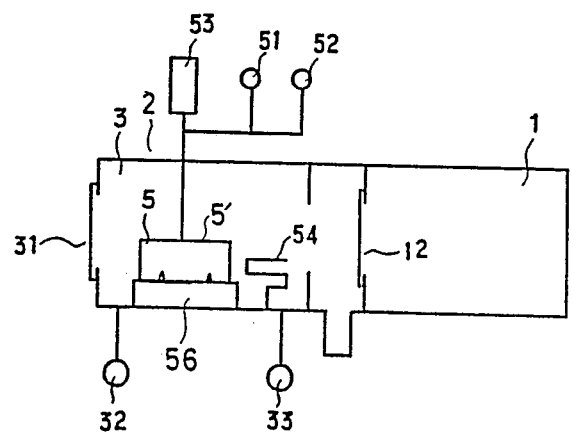

The procedure for unloading the workpiece from the processing chamber 1 is shown by FIGS. 9-12. As shown in FIG. 9, the main chamber 3 is evacuated by an evacuating device 33, which is, for example, a vacuum pump. When the pressure difference between the main chamber 3 and the second chamber 5 reaches a predetermined value, the slow leak seal 55 begins to allow the gas in the second chamber 5 to leak into the main chamber 3. The second chamber 5 may also be provided with an evacuating means 52, for example, a vacuum pump, to evacuate it quickly and independently. However, the pressure of the second chamber 5 must be kept greater than or equal to that of the main chamber 3.

Figure 10:
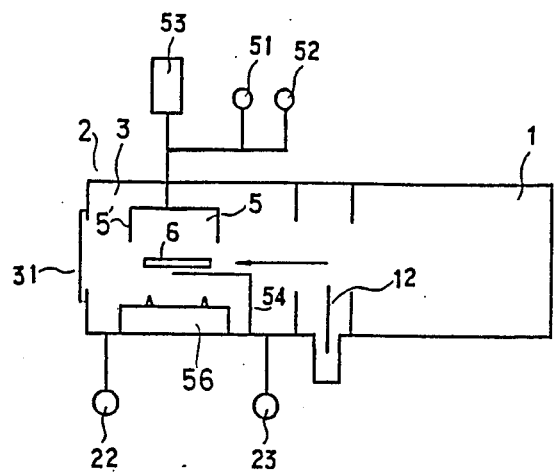

As shown in FIG. 10, a gate 12, between the processing chamber 1 and unloading chamber 2, is opened. Opening the gate 12 does not cause a turbulent gas flow because both the chambers are in a vacuum, and, therefore, no dust settles on the workpiece. Through the opened gate 12, the workpiece 6 is transferred by the carrier 54 from the processing chamber 1 into the second chamber 5, and placed on the table 56 under the bell jar 5'.

Figure 11:
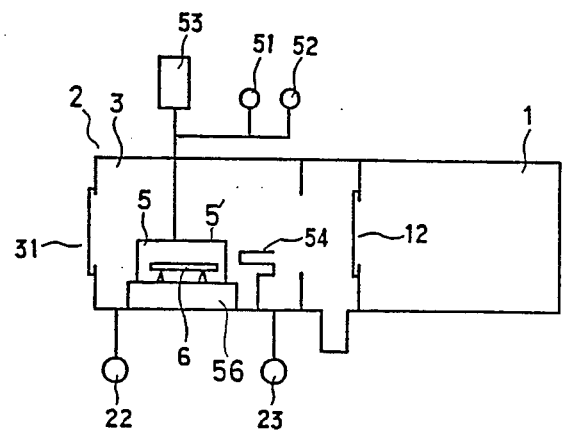

Next, as shown in FIG. 11, the bell jar 5' is lowered by the driving means 53, and closed. A gas introduction means 51 introduces filtered gas (nitrogen gas for example) into the second chamber 5 until the pressure reaches atmospheric pressure. The air introduction means 22 also introduces filtered pure gas into the main chamber 3 while keeping the gas pressure of the second chamber 5 the same or higher than that of the main chamber 3.

The speed of gas introduction into the second chamber 5 is slow enough to suppress the generation of a turbulent gas flow therein. Therefore, although there is some dust deposited on the inner surface of the second chamber 5, the chance of dust being deposited on the workpiece during the gas introduction period is very small.

According to conventional unloading chambers which do not employ the second chamber 5, it takes five minutes or more to fill the unloading chamber 3, which has a volume of, for example, 12 liters, because the gas must be introduced slowly. In contrast, according to the present invention, the second chamber 5 has a volume of less than, for example, 1.2 liters, so that it takes only 30 seconds to fill the chamber with gas. Since the workpiece 6 is covered by the bell jar 5', it is not necessary to control the introduction of gas into the large main chamber 3. Therefore, the unloading chamber 3 can be filled very quickly. This lessens the total time required for processing and results in an increased production rate.

Figure 12:
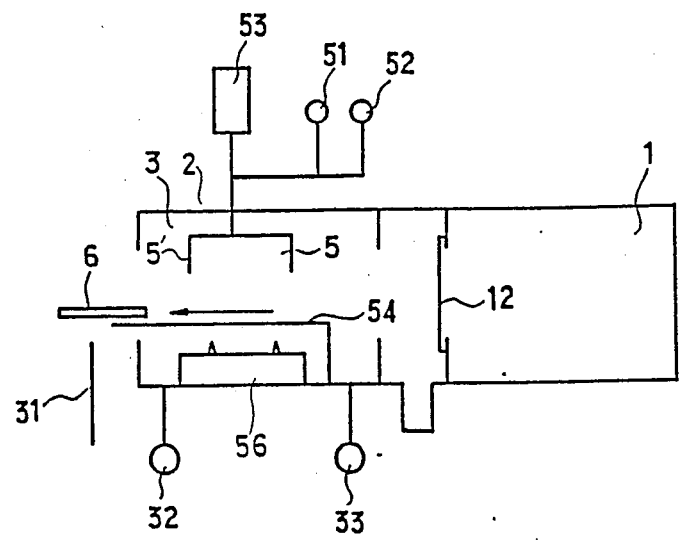

Both the chambers are held calm or undisturbed for several minutes until the floating dust settles. Then, as shown in FIG. 12, the gate 31 and the second chamber 5 are both opened, and the carrier 54 moves the workpiece 6 out of the second chamber 5 and to the outside of the loading chamber 2 through the opened gate 31 to complete an unloading process.

According to data taken by the inventor, the amount of dust particles larger than 0.11 microns floating in the gas within the loading chamber is approximately 10,000 per cubic foot when gas is introduced to fill a vacuum chamber. The amount of dust particles decreases relatively fast to less than 100 per cubic foot within three minutes of settling down time, but the decrease in the amount of floating dust particles is very slow thereafter. This means almost 99% of floating dust settles and deposits on the surface of equipment or parts and the workpiece within three minutes.

During the evacuation cycle, some of the dust is exhausted to the outside by the vacuum pump, but the dust which exists in the space above the workpiece settles on the workpiece. The amount of settled dust is roughly proportional to the height of the space over the workpiece. Therefore, the low height of the second chamber 5 contributes to the decrease in the amount of dust which settles on the workpiece. The amount of dust deposited on the workpiece is also related to the amount of the dust already existing in the chamber. Therefore, the volume of the second chamber 5 should be as small as possible. In the above-described embodiment, the amount of dust particles deposited on the workpiece is decreased to less than one tenth that of the prior art.

It is another advantage of the present invention that the workpiece is protected from unwanted contamination by harmful gas used in the processing chamber 1 during, for example, dry etching. Even though the processing chamber 1 is evacuated after the dry etching process, some harmful etching gas remains on the surfaces of the transfer means 54, etc., and invades the loading chamber. This gas evaporates during an evacuation cycle of the loading chamber 2 and is deposited on other surfaces within the chamber and the workpiece. Repetition of this processing and evacuation cycle increases the deposited harmful gas and its re-evaporation may possibly contaminate the workpiece. In the present invention, however, there is no chance of exposing the inside of the second chamber 5 to the harmful gas vapor.

Figure 13:
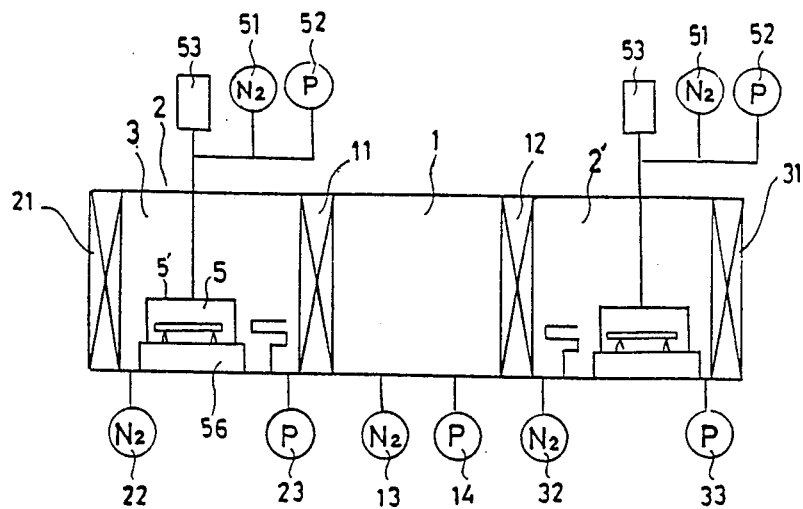
FIG. 13 is a second embodiment of the present invention in which two loading chambers are provided for loading and unloading the workpiece, respectively, and each main chamber has a second chamber.

The second embodiment of the present invention is a loadlock system shown in FIG. 13. One loading chamber 2 is provided exclusively for loading the workpiece 6, and another loading chamber 2' is provided exclusively for unloading the workpiece 6 from the work chamber 1. The steps of loading and unloading the workpiece are similar to those described with respect to FIGS. 4–12. The same or similar reference numerals designate the same or similar parts. The advantage of this embodiment is a faster cycling time for loading and unloading the workpiece than that of the first embodiment. This results in a better production rate.

Figure 14:
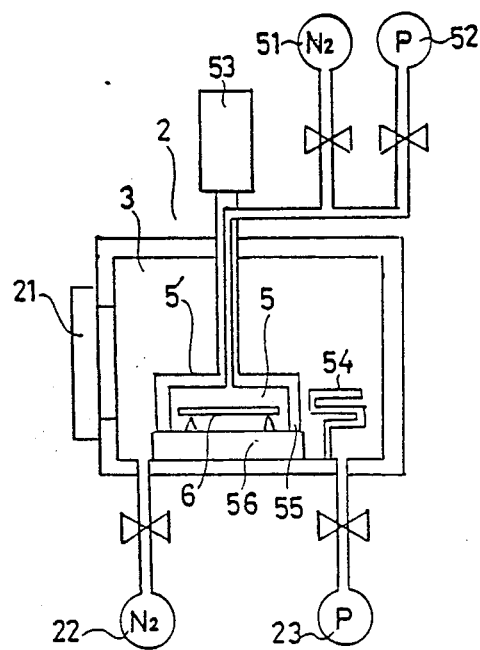
FIG. 14 is a third embodiment of the present invention in which the second chamber is included in a processing chamber, and the workpiece is directly loaded into and unloaded from the processing chamber.

FIG. 14 is a third embodiment of the present inention, in which a workpiece is directly loaded into and unloaded from a processing chamber without passing through a loading chamber. In this embodiment, the loading chamber 2 becomes the processing chamber. Though they are not shown in the figures, necessary equipment or tools for processing the workpiece must be provided in the main chamber 3. If such eqiupment or tools are provided in the main chamber 3, the chance of contamination increases, but the second chamber 5 protects the workpiece and contamination is thereby avoided. The advantage of this embodiment is the simplicity of the structure, and is applicable to a so-called batch system.

In the above-described embodiments, the workpiece 6, for example, a semiconductor wafer, is held horizontally in the second chamber. However, this does not exclude holding the main surface of the workpiece vertically or up-side-down. The advantage of such a holding mode is to avoid vertical deposition of dust on the main surface of the workpiece.

While nitrogen gas is referred to as a representative gas with respect to the embodiments, it is to be understood that other gases, such as air, may be applicable depending upon the type of processing desired.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. An apparatus for loading and unloading a workpiece into and from a vacuum chamber for processing the workpiece, said apparatus comprising:
    a loadlock chamber coupled to the vacuum chamber, the workpiece being loaded into or unloaded from the vacuum chamber through said loadlock chamber and the workpiece being loaded from or unloaded into an external atmosphere through said loadlock chamber;
    evacuation means, operatively connected to said loadlock chamber, for evacuating said loadlock chamber;
    gas introduction means, operatively connected to said loadlock chamber, for introducing gas into said loadlock chamber;
    first gate means, provided between the external atmosphere and said loadlock chamber, for allowing loading said workpiece into and unloading said workpiece from said loadlock chamber, said first gate means being capable of opening or providing a vacuum seal between said loadlock chamber and the outside;
    second gate means, provided between the vacuum chamber and said loadlock chamber, for allowing transfer of the workpiece to and from said loadlock chamber into the vacuum chamber, said second gate means being vacuum sealed when said first gate means is open or when inner pressure of said loadlock chamber is higher than a predetermined level;
    a table provided in said loadlock chamber on which the workpiece is placed;
    a second chamber, provided in said loadlock chamber, being capable of contacting said table for enclosing the workpiece and isolating the workpiece from said loadlock chamber while said loadlock chamber is being evacuated or gas is being introduced therein, said second chamber having a bottom opening having a periphery;
    pressure control means, connected to said second chamber, for keeping the gas pressure in said second chamber greater than or equal to the gas pressure in said loadlock chamber by providing a slow leak means around the periphery of the bottom opening said second chamber; and
    transfer means, located outside of said second chamber and within said loadlock chamber, for transferring the workpiece, positioning the workpiece on said table, and moving the workpiece from said table while said second chamber is separated from said table so as to expose said workpiece in said loadlock chamber.

2. An apparatus according to claim 1, wherein said pressure control means comprises second gas introduction means for introducing gas into said second chamber.

3. An apparatus according to claim 1, wherein said pressure control means comprises second evacuation means for evacuating said second chamber.

4. An apparatus according to claim 1, wherein said slow leak means is an O-ring attached to the periphery of the bottom opening of said second chamber.

5. An apparatus according to claim 1, wherein said second chamber comprises a bell jar capable of moving up and down in said main chamber, a bottom of said bell jar being opened when said bell jar is moved up, and being closed upon contacting said table when said bell jar is lowered onto said table.

6. An apparatus accoridng to claim 5, further comprising shifting means, connected to said bell jar, for moving said bell jar up or down.

7. A vacuum process chamber for processing a workpiece, comprising:
    a main chamber for processing the workpiece, the workpiece being loaded from or unloaded into an external atmosphere through said main chamber;
    evacuation means, operatively connected to said main chamber, for evacuating said main chamber;
    gas introduction means, operatively connected to said main chamber, for introducing gas into said main chamber;
    gate means, provided between the external atmosphere and said main chamber, for allowing loading or unloading of the workpiece into said main chamber, said gate means capable of opening or providing a vacuum seal between said main chamber and the external atmosphere;
    a table provided in said main chamber on which the workpiece is placed;
    a second chamber, provided in said main chamber, capable of contacting said table and for enclosing the workpiece and isolating the workpiece from said main chamber while said main chamber is being evacuated or gas is being introduced therein, said second chamber having bottom opening having a periphery;
    pressure control means, connected to said second chamber, for keeping gas pressure in said second chamber greater than or equal to that in said main chamber by providing a slow leak means on the periphery of the bottom opening of said second chamber; and
    transfer means, located outside said second chamber and within said main chamber, for transferring the workpiece, positioning the workpiece on said table, and moving the workpiece from said table while said second chamber is separated from said table so as to expose said workpiece in said main chamber.

8. A vacuum processing chamber according to claim 7, wherein said pressure control means comprises second gas introduction means for introducing gas into said second chamber.

9. A vacuum processing chamber according to claim 7, wherein said pressure control means comprises second evacuation means for evacuating said second chamber.

10. A vacuum processing chamber according to claim 7, wherein said slow leak maans is an O-ring attached to the periphery of the bottom opening of said second chamber.

11. A vacuum processing chamber according to claim 7, wherein said second chamber is a bell jar capable of moving up and down in said main chamber, a bottom of said bell jar being opened when it is moved up, and being closed upon contacting said table when said bell jar is lowered to said table.

12. A vacuum processing chamber according to claim 11, further comprising shifting means, connected to said second chamber, for moving said bell jar up or down.

* * * * *